(12) United States Patent
Ye

(10) Patent No.: US 12,342,483 B2
(45) Date of Patent: Jun. 24, 2025

(54) ELECTRONIC DEVICE

(71) Applicant: VIVO MOBILE COMMUNICATION CO., LTD., Dongguan (CN)

(72) Inventor: Jian Ye, Dongguan (CN)

(73) Assignee: VIVO MOBILE COMMUNICATION CO., LTD., Dongguan (CN)

(*) Notice: Subject to any disclaimer, the term of this patent is extended or adjusted under 35 U.S.C. 154(b) by 214 days.

(21) Appl. No.: 18/212,717

(22) Filed: Jun. 22, 2023

(65) Prior Publication Data

US 2023/0337380 A1 Oct. 19, 2023

Related U.S. Application Data

(63) Continuation of application No. PCT/CN2021/139093, filed on Dec. 17, 2021.

(30) Foreign Application Priority Data

Dec. 24, 2020 (CN) .......................... 202011550496.1

(51) Int. Cl.
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
CPC .... G06F 1/1681; G06F 1/1616; G06F 1/1652; G06F 1/1618; G06F 1/1641; G06F 1/1601; G06F 1/1626; H05K 5/0226; H05K 5/0017; E05D 3/122; E05D 3/06; E05D 3/12; E05D 3/18; E05D 11/0054; E05D 11/087; E05D 11/082; E05D 11/1028; E05D 11/1064

See application file for complete search history.

(56) References Cited

U.S. PATENT DOCUMENTS

| | | | | |
|---|---|---|---|---|
| 3,483,588 A | * | 12/1969 | Hover | B63B 19/203 16/354 |
| 5,966,777 A | * | 10/1999 | Jantschek | E04B 2/7431 16/354 |
| 9,507,388 B1 | | 11/2016 | Hampton et al. | |
| 10,352,354 B1 | * | 7/2019 | Hsu | G06F 1/1652 |
| 2016/0227645 A1 | * | 8/2016 | Hampton | G06F 1/1681 |

(Continued)

FOREIGN PATENT DOCUMENTS

| CN | 108520701 A | 9/2018 |
|---|---|---|
| CN | 208190691 U | 12/2018 |

(Continued)

OTHER PUBLICATIONS

Extended European Search Report issued in related European Application No. 21909289.7, mailed Apr. 26, 2024, 11 pages.

(Continued)

*Primary Examiner* — Abhishek M Rathod
(74) *Attorney, Agent, or Firm* — IPX PLLC

(57) ABSTRACT

An electronic device is provided. The electronic device includes: a screen support, a hinge support, a gear, a rack, and a connecting rod assembly. The gear is fastened to the screen support through the hinge support. The gear is meshed with the rack for transmission. The rack is rotatably connected to the connecting rod assembly. The connecting rod assembly is slidably connected to the screen support.

9 Claims, 4 Drawing Sheets

(56) References Cited

U.S. PATENT DOCUMENTS

| | | | |
|---|---|---|---|
| 2019/0086960 A1 | 3/2019 | Jiang et al. | |
| 2019/0174645 A1* | 6/2019 | Jeon | G06F 1/1681 |
| 2020/0012322 A1 | 1/2020 | Jan et al. | |
| 2020/0329573 A1* | 10/2020 | Huang | H05K 5/0017 |
| 2021/0076520 A1* | 3/2021 | Yen | H04M 1/022 |

FOREIGN PATENT DOCUMENTS

| | | |
|---|---|---|
| CN | 110266836 A | 9/2019 |
| CN | 110293913 A | 10/2019 |
| CN | 209801052 U | 12/2019 |
| CN | 110971725 A | 4/2020 |
| CN | 111314516 A | 6/2020 |
| CN | 111741146 A | 10/2020 |
| CN | 211628599 U | 10/2020 |
| CN | 111901461 A | 11/2020 |
| CN | 111968514 A | 11/2020 |
| CN | 112533404 A | 3/2021 |
| EP | 3282341 A1 | 2/2018 |
| GB | 191003796 A | 3/1910 |
| TW | M603662 U | 11/2020 |

OTHER PUBLICATIONS

International Search Report issued in corresponding International Application No. PCT/CN2021/139093, mailed Jan. 30, 2022, 7 pages.
First Office Action issued in corresponding CN Patent Application No. 202011550496.1, dated Aug. 27, 2021, 7 pages.
Second Office Action issued in corresponding CN Patent Application No. 202011550496.1, dated Apr. 19, 2022, 5 pages.

* cited by examiner

ELECTRONIC DEVICE

CROSS-REFERENCE TO RELATED APPLICATIONS

This application is a continuation of International Application No. PCT/CN2021/139093, filed on Dec. 17, 2021, which claims priority to Chinese Patent Application No. 202011550496.1, filed on Dec. 24, 2020. The entire contents of each of the above-referenced applications are expressly incorporated herein by reference.

TECHNICAL FIELD

Embodiments of this application relate to the field of communications technologies, and in particular to an electronic device.

BACKGROUND

With the development of electronic device technologies, consumers need larger screens to browse webs and watch videos. In addition, consumers are not satisfied with an appearance of a single bar-type electronic device, and anticipate more forms and more functions. To meet requirements of the consumers to browse webs and watch videos, larger screens are often used. However, mobile phones with larger screens are not carried easily, bring a poor feeling when held with hands, and often consume more power. In addition, the mobile phones with larger screens have simple appearances, lacking diversity and flexibility. Therefore, manufacturers have successively introduced solutions for foldable screens.

In an existing solution for design of a hinge for a foldable screen, a plurality of pairs of meshing gears are disposed, and a sliding rail slot is disposed to guide folding of the screen. Design of the plurality of gears requires extremely high assembly accuracy. A little assembly deviation may lead to jamming when a screen is bent. In the design of the sliding rail slot, dust may enter the sliding rail slot after use for a period of time, which will lead to unsmooth movement of a sliding rail and jamming when the screen is bent.

SUMMARY

Embodiments of this application are intended to provide an electronic device.

An embodiment of this application provides an electronic device, including: a first screen support, a second screen support, a flexible screen, a first hinge support, a second hinge support, a first gear, a second gear, a rack, a first connecting rod assembly, and a second connecting rod assembly.

One end of the flexible screen is fastened to the first screen support, and the other end is fastened to the second screen support.

The first hinge support is fastened to the first screen support, and the second hinge support is fastened to the second screen support.

The first gear is fastened to the first hinge support, and the second gear is fastened to the second hinge support.

The rack is located between the first gear and the second gear, and includes a meshing part and a connecting part. Two opposite side surfaces of the meshing part are provided with a gear tooth structure, one side of the meshing part meshes with the first gear, and the other side meshes with the second gear.

A first end of the first connecting rod assembly is rotatably connected to the connecting part, a second end of the first connecting rod assembly is slidably connected to the first screen support, a first end of the second connecting rod assembly is rotatably connected to the connecting part, and a second end of the second connecting rod assembly is slidably connected to the second screen support.

By meshing of the first gear and the second gear with the rack, the first screen support and the second screen support can rotate relative to each other and drive the flexible screen to switch between a folded state and an unfolded state.

In this embodiment of this application, the gears are matched with the rack, so that a rotating structure of the foldable screen is simplified. In addition, transmission of gears and the rack achieves a stable working state and high reliability, and jamming seldom occurs. When the rack moves, movement of a screen support can be limited by a connecting rod assembly, so that the screen support moves stably and is not easily jammed, increasing smoothness of screen folding, improving use feel of the electronic device, and improving use experience.

DETAILED DESCRIPTION

Figure 1:
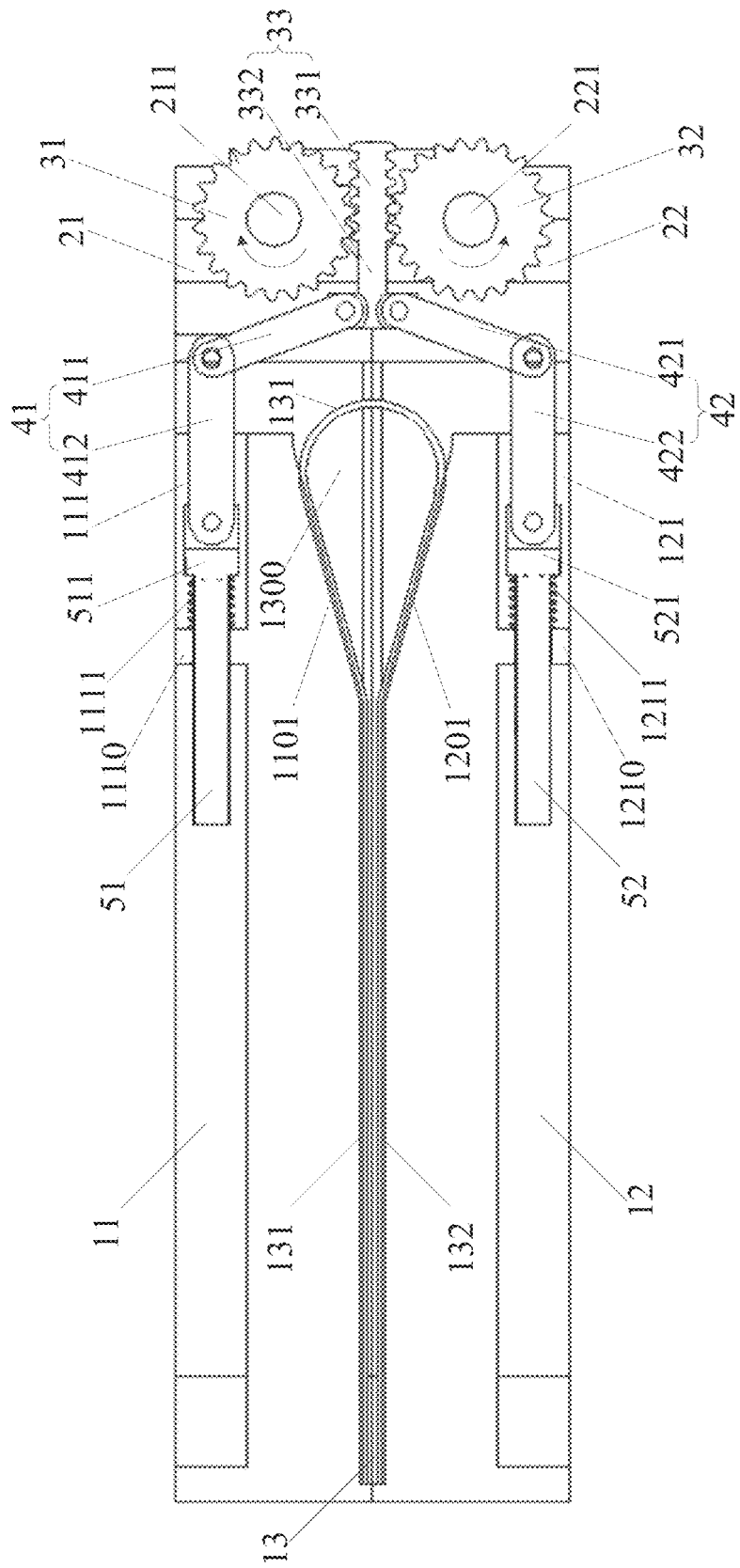
FIG. 1 is a schematic diagram of a structure of an electronic device according to an embodiment of this application.

The following clearly describes the technical solutions in the embodiments of this application with reference to the accompanying drawings in the embodiments of this application. Apparently, the described embodiments are some rather than all of the embodiments of this application. All other embodiments obtained by a person of ordinary skill in the art based on embodiments of this application without creative efforts shall fall within the protection scope of this application.

Terms "first" and "second" in the specification and claims of this application are used to distinguish between similar objects, and do not need to be used to describe a specific order or sequence. It should be understood that, data used in such a way are interchangeable in proper circumstances, so that the embodiments of this application can be implemented in an order other than the order illustrated or described herein. Objects classified by "first", "second", and the like are usually of a same type, and the number of objects is not limited. For example, there may be one or more first objects. In addition, in the specification and the claims, "and/or" represents at least one of connected objects, and a character "/" generally represents an "or" relationship between associated objects.

With reference to the accompanying drawings, an electronic device provided in the embodiments of this application will be described in detail by using examples and application scenarios of the embodiments of this application.

Refer to FIG. 1 to FIG. 4, an embodiment of this application provides an electronic device, including: a first screen support 11, a second screen support 12, a flexible screen 13, a first hinge support 21, a second hinge support 22, a first gear 31, a second gear 32, a rack 33, a first connecting rod assembly 41, and a second connecting rod assembly 42.

One end of the flexible screen 13 is fastened to the first screen support 11, and the other end is fastened to the second screen support 12. In this way, the flexible screen 13 can be unfolded as the first screen support 11 and the second screen support 12 are mutually opened, and folded as the first screen support 11 and the second screen support 12 are mutually closed. It can be understood that, as shown in FIG. 1, in some embodiments, the flexible screen 13 includes a first part 131, a second part 132, and an intermediate part 133 connecting the first part 131 and the second part 132. The first part 131 is fastened to the first screen support 11, and the second part 132 is fastened to the second screen support 12. A first inclined surface 1101 (for example, an oblique plane or an oblique curved surface) is disposed on the first screen support 11. A second inclined surface 1201 (for example, an oblique plane or an oblique curved surface) is disposed on the second screen support 12. When the flexible screen 13 is in a folded state, the first inclined surface 1101 and the second inclined surface 1201 form accommodation space 1300, and the intermediate part 133 of the flexible screen 13 is bent to form a bent part. The bent part is accommodated in the accommodation space 1300. In this way, after the flexible screen 13 is folded, a bent part of the intermediate part can be accommodated in accommodation space formed by an inclined plane (or inclined curved surface) on the first screen support 11 and an inclined plane (or inclined curved surface) on the second screen support 12, which can provide bending space for the flexible screen 13 when the flexible screen is folded and protect a bending region of the flexible screen 13.

The first hinge support 21 is fastened to the first screen support 11, the second hinge support 22 is fastened to the second screen support 12, and the first hinge support 21 is rotatably connected to the second hinge support 22, that is, the first hinge support 21 and the second hinge support 22 can rotate relative to each other. In actual use, to fold and unfold the flexible screen 13, opening and closing of the first screen support 11 and the second screen support 12 can be controlled manually, to drive the first hinge support 21 and the second hinge support 22 to rotate relative to each other.

The first gear 31 is fastened to the first hinge support 21, and the second gear 32 is fastened to the second hinge support 22. It should be noted that the gear and the hinge support are relatively static, that is, the gear and the hinge support move synchronously. Relative rotation of the first hinge support 21 and the second hinge support 22 can be converted into opposite rotation of the first gear 31 and the second gear 32.

The rack 33 is located between the first gear 31 and the second gear 32. The rack 33 includes a meshing part 331 and a connecting part 332. Two opposite sides of the meshing part 331 are provided with gear teeth, and the meshing part 331 separately meshes with the first gear 31 and the second gear 32. In this way, when the first gear 31 and the second gear 32 rotate with the first hinge support 21 and the second hinge support 22, the first gear 31 and the second gear 32 jointly drive the rack 33 to translate. Take a scenario shown in FIG. 1 as an example. When the first gear 31 and the second gear 32 rotate in a direction indicated by an arrow in FIG. 1, the rack 33 translates to the left. When the first gear 31 and the second gear 32 rotate in an opposite direction indicated by the arrow in FIG. 1, the rack 33 translates to the right.

During transmission of gears and the rack, a rotary motion of a gear is transformed into a reciprocating linear motion of the rack, or the reciprocating linear motion of the rack is transformed into the rotary motion of the gear. The transmission of gears and the rack mainly has the following advantages: large power transmission and high efficiency. Matching of the two gears and a rack can achieve long service life, stable operation, and high reliability, and can ensure a constant transmission ratio and transmission of motion between two shafts at any included angle.

A first end of the first connecting rod assembly 41 is rotatably connected to the connecting part 332, a second end of the first connecting rod assembly 41 is slidably connected to the first screen support 11. A first end of the second connecting rod assembly 42 is rotatably connected to the connecting part 332, and a second end of the second connecting rod assembly 42 is slidably connected to the second screen support 12. In this way, when the rack 33 is driven by the first gear 31 and the second gear 32 to move, the first connecting rod assembly 41 and the second connecting rod assembly 42 can be driven to move. Movement of the first connecting rod assembly 41 and the second connecting rod assembly 42 limits movement of the first screen support 11 and the second screen support 12, so that the first screen support 11 and the second screen support 12 move smoothly, and jamming seldom occurs.

Figure 2:
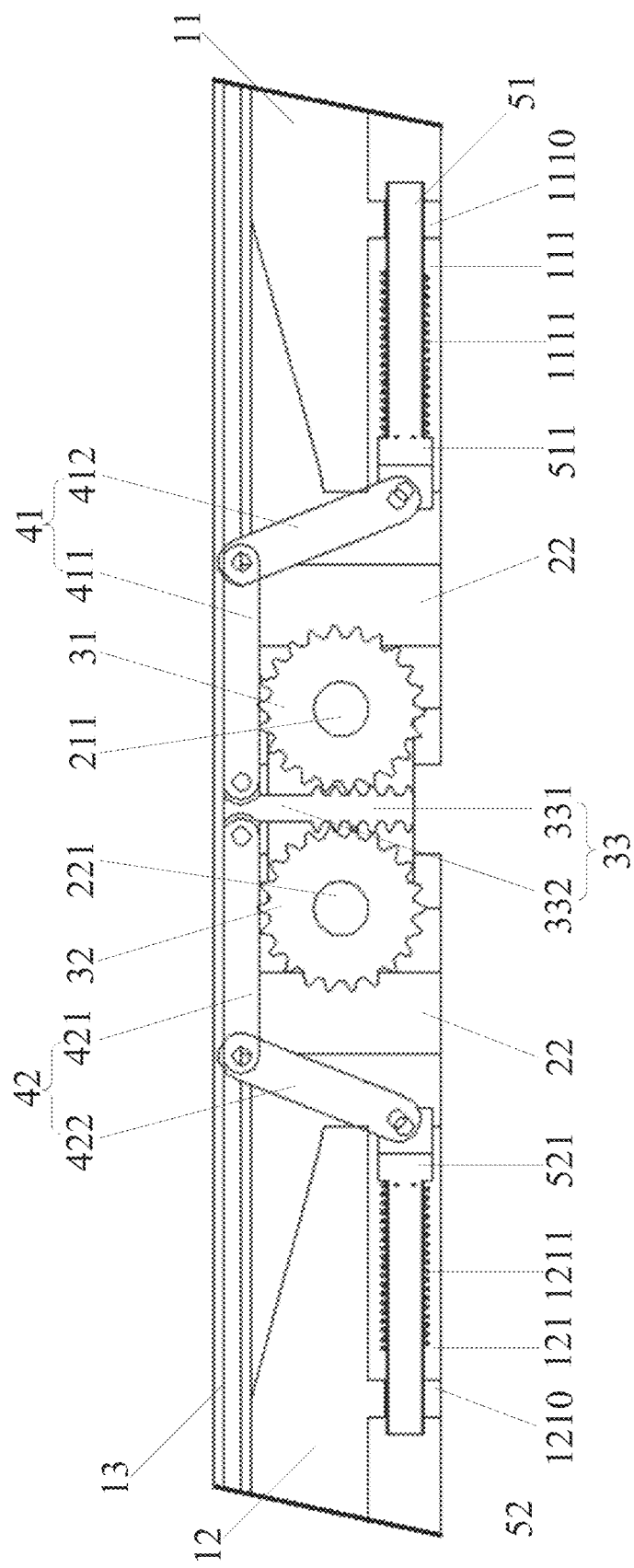
FIG. 2 is a schematic diagram of a structure of an electronic device according to an embodiment of this application.

It should be noted that a reason why sliding connection between the connecting rod assembly and the screen support is because as follows: As shown in FIG. 1 and FIG. 2, a distance between the first screen support 11 and the second screen support 12 changes with time during unfolding and folding of the flexible screen 13. For example, the distance between the first screen support 11 and the second screen support 12 decreases during folding, and the distance between the first screen support 11 and the second screen support 12 increases during unfolding. Therefore, a connection position between a connecting rod assembly and a screen support is to be changed with the change of a distance between the screen supports, and sliding connection is used.

In an embodiment of this application, by meshing of the first gear 31 and the second gear 32 with the rack 33, the first screen support 11 and the second screen support 2 can rotate relative to each other and drive the flexible screen 13 to switch between the folded state (that is, the scenario shown in FIG. 1) and an unfolded state (that is, a scenario shown in FIG. 2).

In this embodiment of this application, the gears are matched with the rack, so that a rotating structure of the foldable screen is simplified. In addition, transmission of gears and the rack achieves a stable working state and high reliability, and jamming seldom occurs. When the rack moves, movement of a screen support can be limited by a connecting rod assembly, so that the screen support moves stably and is not easily jammed, increasing smoothness of screen folding, improving use feel of the electronic device, and improving use experience.

Figure 3:
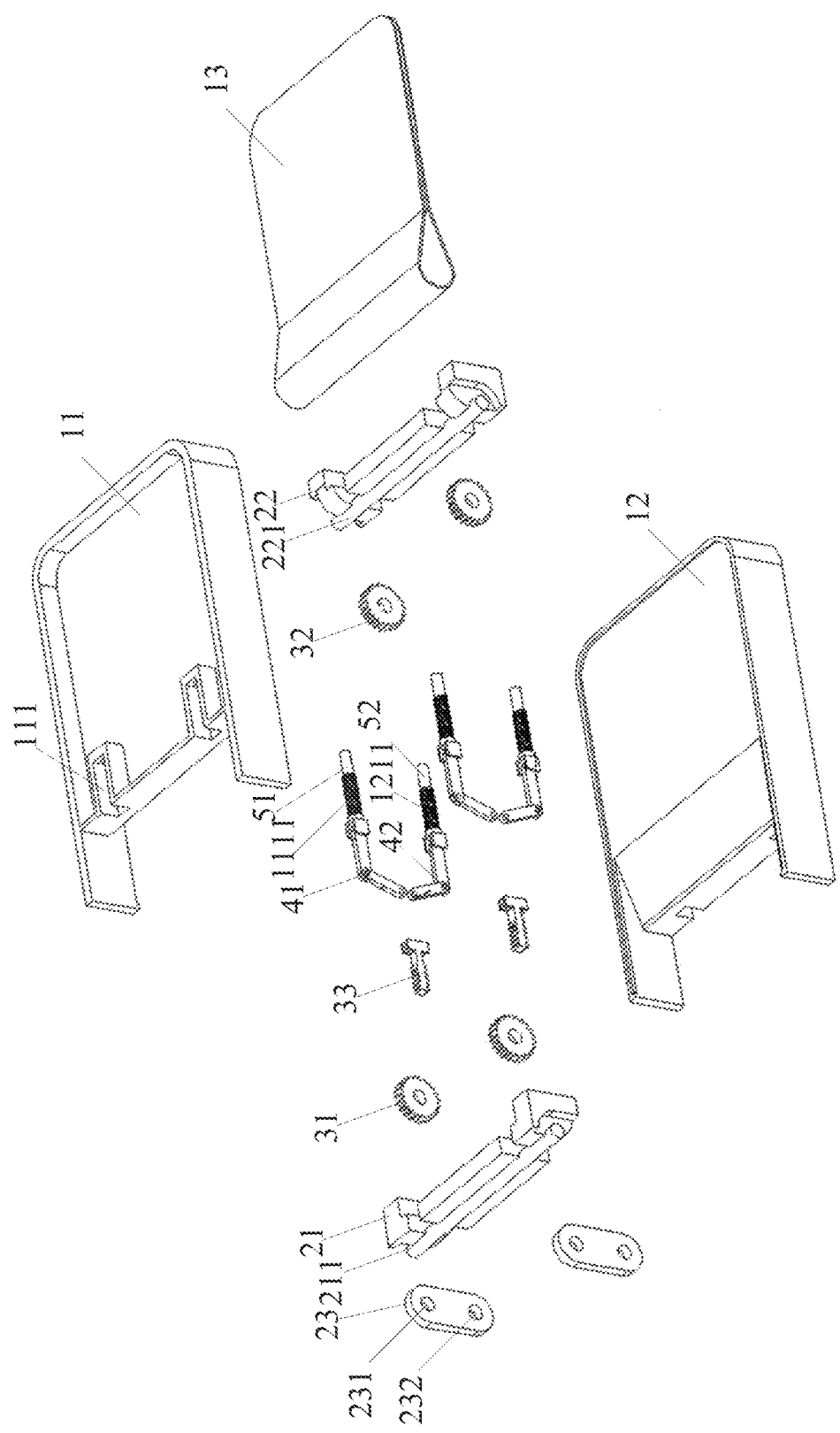
FIG. 3 is a schematic exploded view of FIG. 1.
Figure 4:
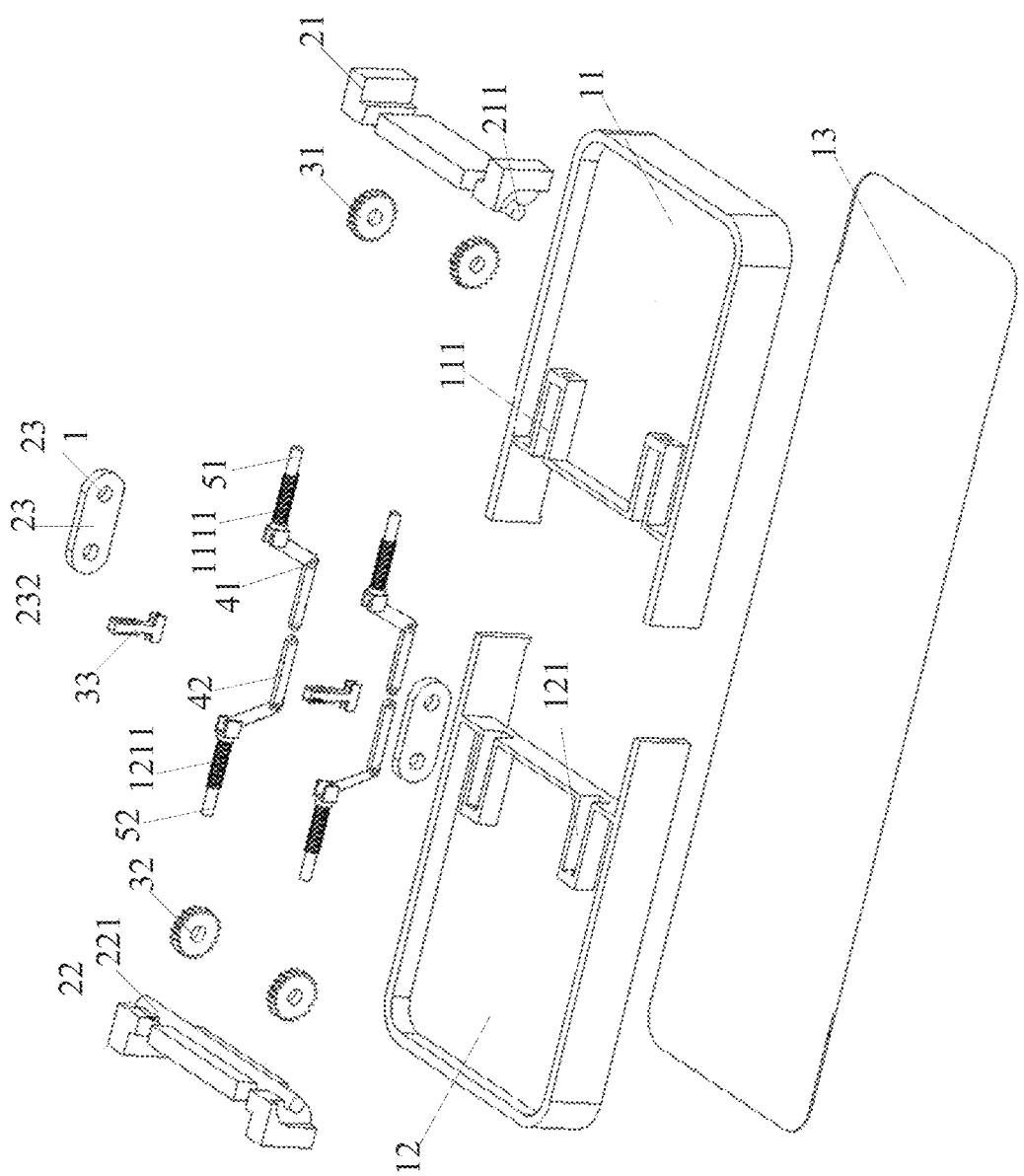
FIG. 4 is a schematic exploded view of FIG. 2.

It should be noted that the first hinge support 21, the second hinge support 22, the first gear 31, the second gear 32, the rack 33, the first connecting rod assembly 41, and the second connecting rod assembly 42 can be collectively referred to as a set of hinge mechanisms. Considering smooth movement and force balance during folding and unfolding, two or more groups of hinge mechanisms can be disposed. FIG. 3 and FIG. 4 show scenarios in which two groups of hinge mechanisms are respectively disposed at both ends of a width direction of the device. A quantity of groups of the hinge mechanisms in the electronic device is not limited in this embodiment of this application.

In some implementations, refer to FIG. 3 and FIG. 4. The electronic device further includes a connector 23. The connector 23 may also be called a hinge rod. A name of the connector 23 is not specifically limited in this embodiment of this application. It can be understood that two connectors 23 can be disposed to ensure smooth movement and force balance during folding and unfolding.

A first rotating shaft 211 is provided on the first hinge support 21, and a second rotating shaft 221 is provided on the second hinge support 22.

A first end of the connector 23 is provided with a first through hole 231, and a second end of the connector is provided with a second through hole 232.

The first rotating shaft 211 passes through the first through hole 231 and is fastened to the first screen support 11, and the second rotating shaft 221 passes through the second through hole 232 and is fastened to the second screen support 12. That is, the first hinge support 21 and the second hinge support 22 are respectively rotatably connected to two ends of the connector 23 through matching of shaft holes, so that the first hinge support 21 and the second hinge support 22 are rotatably connected.

The first gear 31 is firmly sleeved on the first rotating shaft 211, and the second gear 32 is firmly sleeved on the second rotating shaft 221.

In an embodiment of this application, through a structure of the rotating shaft on the hinge support, fastening between the hinge support and the screen support, rotation matching between the hinge support and the connector, and a rotation pivot provided for the gear are implemented simultaneously, simplifying a structure and reducing an assembly difficulty and required assembly accuracy.

In some implementations, refer to FIG. 1 and FIG. 2. The first connecting rod assembly 41 includes a first connecting rod 411 and a second connecting rod 412, and the second connecting rod assembly 42 includes a third connecting rod 421 and a fourth connecting rod 422.

A first end of the first connecting rod 411 is rotatably connected to the connecting part 332, a second end of the first connecting rod 411 is rotatably connected to a first end of the second connecting rod 412, and a second end of the second connecting rod 412 is slidably connected to the first screen support 11. A first end of the third connecting rod 421 is rotatably connected to the connecting part 331, a second end of the third connecting rod 421 is rotatably connected to a first end of the fourth connecting rod 422, and a second end of the fourth connecting rod 422 is slidably connected to the second screen support 12.

In an embodiment of this application, the connecting rod assembly has a double-connecting-rod structure, which can save internal space of the device, simplify a transmission structure, and reduce production costs while motion transmission is satisfied.

In some implementations, as shown in FIG. 2, when the flexible screen 3 is unfolded to a horizontal state, the first connecting rod 411 and the third connecting rod 421 are both parallel to the flexible screen 3, and a side surface of the first connecting rod 411 and a side surface of the third connecting rod 421 both abut against the flexible screen 3.

In an embodiment of this application, when the flexible screen 3 is unfolded to a horizontal state, the first connecting rod 411 and the third connecting rod 421 are parallel to a bottom of the flexible screen 3, to support the bottom of the flexible screen 3, increasing external pressure resistance of an intermediate region of the flexible screen 3.

In some implementations, refer to FIG. 1 and FIG. 2. The electronic device further includes a first sliding rod 51 and a second sliding rod 52.

The first screen support 11 is provided with a first sliding slot 111, and the second screen support 12 is provided with a second sliding slot 121.

A second end of the second connecting rod 412 is rotatably connected to a first end of the first sliding rod 51, and the first sliding rod 51 is slidably connected to the first sliding slot 111.

A second end of the fourth connecting rod 422 is rotatably connected to a first end of the second sliding rod 52, and the second sliding rod 52 is slidably connected to the second sliding slot 121.

In an embodiment of this application, sliding connection between a connecting rod and a screen support is implemented through matching of a sliding rod and a sliding slot. A connecting rod is rotatably connected to a sliding rod, and a sliding rod is slidably connected to a sliding slot. Design of combination of a connecting rod and a sliding rod has good tolerance of structural assembly, so that interference does not occur easily, and jamming is prevented.

For example, still refer to FIG. 1 and FIG. 2. The first sliding slot 111 has a first slot bottom 1110, and the second sliding slot has a second slot bottom 1210.

When the flexible screen 3 is switched from the folded state to the unfolded state, that is, from the scenario shown in FIG. 1 to the scenario shown in FIG. 2, the second connecting rod 412 drives the first sliding rod 51 to move toward a direction away from the first slot bottom 1110, and the fourth connecting rod 422 drives the second sliding rod 52 to move toward a direction away from the second slot bottom 1210.

When the flexible screen 3 is switched from the unfolded state to the folded state, that is, from the scenario shown in FIG. 2 to the scenario shown in FIG. 1, the second connecting rod 412 drives the first sliding rod 51 to move toward a direction close to the first slot bottom 1110, and the fourth connecting rod 422 drives the second sliding rod 52 to move toward a direction close to the second slot bottom 1210.

In this way, during screen folding or unfolding, no matter what an angle the screen support moves at, a connecting rod and a sliding rod can be adaptively matched, so that the sliding rod moves along a fixed straight line direction in the sliding slot, to limit movement of the screen support in real time, ensuring smooth movement of the screen support.

Further, the first slot bottom 1110 is provided with a third through hole, and the second slot bottom 1210 is provided with a fourth through hole.

As shown in FIG. 2, when the flexible screen 3 is unfolded to a horizontal state, a second end of the first sliding rod 51 extends out of the first slot bottom 1110 from the third through hole, and a second end of the second sliding rod 52 extends out of the second slot bottom 1210 from the fourth through hole.

In this embodiment of this application, the flexible screen 3 is unfolded to a horizontal state in a scenario in which the distance between the first screen support 11 and the second screen support 12 is maximized. In this scenario, the sliding rod can still extend from the slot bottom of the sliding slot, which can ensure that the flexible screen 3 is folded to any angle from 0° to 180°. It can be ensured that the sliding rod can be slidably connected to the sliding slot, to limit movement of the screen support in real time and ensure smooth movement of the screen support.

Still further, a first elastic member 1111 is disposed in the first sliding slot 111, and a second elastic member 1211 is disposed in the second sliding slot 121.

A first end of the first sliding rod 51 is provided with a first limiting part 511, and a first end of the second sliding rod 52 is provided with a second limiting part 521. In some alternative embodiments, the first limiting part 511 may be a boss integrally molded with the first sliding rod 51, and the second limiting part 521 may be a boss integrally molded with the second sliding rod 52.

The first elastic member 1111 is fastened to the first limiting part 511 or the first slot bottom 1110, and the second elastic member 1211 is fastened to the second limiting part 521 or the second slot bottom 1210.

In this embodiment of this application, an elastic member is disposed in a sliding slot, and a limiting part is correspondingly disposed on a sliding rod. In combination with movement of a sliding rod in a sliding slot, when the sliding rod moves towards a slot bottom of the sliding slot, an elastic member is squeezed under the action of the limiting part. Correspondingly, the elastic member feeds back a reverse elastic force to the sliding rod as a resistance against movement of the sliding rod. The resistance can be reflected to a user's hand after being transmitted through the sliding rod, the connecting rod, the rack, the gear, the hinge support, and the screen support. That is, by disposing the elastic member, a damping effect can be generated when the user folds a screen, and a soft hand feeling can be generated when the screen is bent and folded back, providing better use experience to the user.

Further, when the flexible screen 3 is unfolded to the horizontal state, both the first elastic member 1111 and the second elastic member 1211 are in a compressed state.

In this embodiment of this application, the flexible screen 3 is unfolded to the horizontal state in a scenario in which the distance between the first screen support 11 and the second screen support 12 is maximized. In this scenario, a distance between a limiting part on a sliding rod and a slot bottom of a sliding slot is maximized. In this case, the elastic member is in a compressed state. In this way, when the flexible screen 3 is folded at an arbitrary angle of 0° to 180°, both the limiting part and the slot bottom of the sliding slot can squeeze the elastic member, and the elastic member can always generate an elastic force, ensuring that the user can always feel a damping feeling while folding a screen, and improving use experience.

In some alternative embodiments, when the flexible screen 3 is unfolded to the horizontal state, the first elastic member 1111 and the second elastic member 1211 may also be in a natural state. In this scenario, a natural length of the elastic member is equal to the distance between a limiting part on a sliding rod and a slot bottom of sliding slot. In this way, when the flexible screen begins to be folded, the elastic member can be compressed, so that the elastic member can always generate an elastic force during folding of the flexible screen 3.

In some implementations, the first elastic member 1111 is a first spring, and a second spring is disposed in the second sliding slot 121.

The first spring is sleeved on the first sliding rod 51, and the second spring is sleeved on the second sliding rod 52.

A diameter of the first spring is larger than an aperture of a third through hole, and a diameter of the second spring is larger than an aperture of a fourth through hole.

In this embodiment of this application, the elastic member is a spring sleeved on a sliding rod, and a structure of the spring sleeved on the sliding rod can save occupied space and further reduce a size of the sliding slot. A diameter of the spring is larger than an aperture of a through hole at a slot bottom of the sliding slot, which can prevent the spring, when squeezed, from falling from the slot bottom of the sliding slot.

It should be noted that, in this specification, the terms "include", "comprise", or their any other variant is intended to cover a non-exclusive inclusion, so that a process, a method, an article, or an apparatus that includes a list of elements not only includes those elements but also includes other elements which are not expressly listed, or further includes elements inherent to such process, method, article, or apparatus. An element limited by "includes a . . . " does not, without more constraints, preclude the presence of additional identical elements in the process, method, article, or apparatus that includes the element. In addition, it should be noted that a scope of the method and the apparatus in the implementations of this application is not limited to: performing a function in a sequence shown or discussed, and may further include: performing a function in a basically simultaneous manner or in a reverse sequence based on an involved function. For example, the described method may be performed in a different order, and various steps may be added, omitted, or combined. In addition, features described with reference to some examples may be combined in other examples.

According to the descriptions of the foregoing implementations, a person skilled in the art may clearly understand that the foregoing method embodiments may be implemented by using software and a required universal hardware platform, or may be implemented by using hardware. In some embodiments, the technical solutions of this application essentially or the part contributing to existing technologies may be implemented in a form of a software product. The computer software product is stored in a storage medium (such as a ROM/RAM, a magnetic disk, or an optical disc) and includes several instructions for instructing a terminal (which may be a mobile phone, a computer, a server, an air conditioner, or a network device) to execute the methods described in the embodiments of this application.

The embodiments of this application are described with reference to the accompanying drawings. However, this application is not limited to the foregoing implementations. The foregoing implementations are merely examples, but are not limiting. Under the enlightenment of this application, a person of ordinary skill in the art may make many forms without departing from the objective and the scope of the claims of this application, and these forms all fall within the protection scope of this application.

The invention claimed is:

1. An electronic device, comprising: a first screen support; a second screen support; a flexible screen; a first hinge support; a second hinge support; a first gear; a second gear; a rack; a first connecting rod assembly; a second connecting rod assembly; a first sliding rod; and a second sliding rod, wherein one end of the flexible screen is fastened to the first screen support, and the other end is fastened to the second screen support;

the first hinge support is fastened to the first screen support, and the second hinge support is fastened to the second screen support;

the first gear is fastened to the first hinge support, and the second gear is fastened to the second hinge support;

the rack is located between the first gear and the second gear, and comprises a meshing part and a connecting part, two opposite side surfaces of the meshing part are provided with a gear tooth structure, one side of the meshing part meshes with the first gear, and the other side meshes with the second gear;

a first end of the first connecting rod assembly is rotatably connected to the connecting part of the rack, a second end of the first connecting rod assembly is slidably connected to the first screen support, a first end of the second connecting rod assembly is rotatably connected to the connecting part of the rack, and a second end of the second connecting rod assembly is slidably connected to the second screen support; and by meshing of the first gear and the second gear with the rack, the first screen support and the second screen support can rotate relative to each other and drive the flexible screen to switch between a folded state and an unfolded state, wherein:

the first connecting rod assembly comprises a first connecting rod and a second connecting rod, and the second connecting rod assembly comprises a third connecting rod and a fourth connecting rod;

a first end of the first connecting rod is rotatably connected to the connecting part, a second end of the first connecting rod is rotatably connected to a first end of the second connecting rod, and a second end of the second connecting rod is slidably connected to the first screen support;

a first end of the third connecting rod is rotatably connected to the connecting part, a second end of the third connecting rod is rotatably connected to a first end of the fourth connecting rod, and a second end of the fourth connecting rod is slidably connected to the second screen support;

the first screen support is provided with a first sliding slot, and the second screen support is provided with a second sliding slot;

the second end of the second connecting rod is rotatably connected to a first end of the first sliding rod, and the first sliding rod is slidably connected to the first sliding slot; and the second end of the fourth connecting rod is rotatably connected to a first end of the second sliding rod, and the second sliding rod is slidably connected to the second sliding slot.

2. The electronic device according to claim 1, wherein the flexible screen comprises a first part, a second part, and an intermediate part connecting the first part and the second part, wherein:

the first part is fastened to the first screen support, and the second part is fastened to the second screen support;

a first inclined surface is disposed on the first screen support, and a second inclined surface is disposed on the second screen support; and when the flexible screen is in the folded state, the first inclined surface and the second inclined surface form accommodation space, the intermediate part of the flexible screen is bent to form a bent part, and the bent part is accommodated in the accommodation space.

3. The electronic device according to claim 1, further comprising a connector, wherein a first rotating shaft is disposed on the first hinge support, and a second rotating shaft is provided on the second hinge support;

a first end of the connector is provided with a first through hole, and a second end of the connector is provided with a second through hole;

the first rotating shaft passes through the first through hole and is fastened to the first screen support, and the second rotating shaft passes through the second through hole and is fastened to the second screen support, and the first gear is firmly sleeved on the first rotating shaft, and the second gear is firmly sleeved on the second rotating shaft.

4. The electronic device according to claim 1, wherein when the flexible screen is unfolded to a horizontal state, the first connecting rod and the third connecting rod are both parallel to the flexible screen, and a side surface of the first connecting rod and a side surface of the third connecting rod both abut against the flexible screen.

5. The electronic device according to claim 1, wherein:

the first sliding slot has a first slot bottom and the second sliding slot has a second slot bottom;

when the flexible screen is switched from the folded state to the unfolded state, the second connecting rod drives the first sliding rod to move toward a direction away from the first slot bottom, and the fourth connecting rod drives the second sliding rod to move toward a direction away from the second slot bottom; and when the flexible screen is switched from the unfolded state to the folded state, the second connecting rod drives the first sliding rod to move toward a direction close to the first slot bottom, and the fourth connecting rod drives the second sliding rod to move toward a direction close to the second slot bottom.

6. The electronic device according to claim 5, wherein:

the first slot bottom is provided with a third through hole, and the second slot bottom is provided with a fourth through hole; and when the flexible screen is unfolded to a horizontal state, a second end of the first sliding rod extends out of the first slot bottom from the third through hole, and a second end of the second sliding rod extends out of the second slot bottom from the fourth through hole.

7. The electronic device according to claim 6, wherein:

a first elastic member is disposed in the first sliding slot, and a second elastic member is disposed in the second sliding slot;

a first limiting part is disposed at the first end of the first sliding rod, and a second limiting part is disposed at the first end of the second sliding rod; and the first elastic member is fastened to the first limiting part or the first slot bottom, and the second elastic member is fastened to the second limiting part or the second slot bottom.

8. The electronic device according to claim 7, wherein when the flexible screen is unfolded to the horizontal state, both the first elastic member and the second elastic member are in a compressed state.

9. The electronic device according to claim 7, wherein:

the first elastic member is a first spring, and a second spring is disposed in the second sliding slot;

the first spring is sleeved on the first sliding rod, and the second spring is sleeved on the second sliding rod; and a diameter of the first spring is larger than an aperture of the third through hole, and a diameter of the second spring is larger than an aperture of the fourth through hole.

\* \* \* \* \*